United States Patent
Yoshikawa et al.

(10) Patent No.: US 10,340,848 B2
(45) Date of Patent: Jul. 2, 2019

(54) I-V MEASUREMENT DEVICE FOR SOLAR CELL, MANUFACTURING METHOD FOR SOLAR CELL, AND SOLAR CELL MODULE

(71) Applicant: KANEKA CORPORATION, Osaka-shi, Osaka (JP)

(72) Inventors: Kunta Yoshikawa, Settsu (JP); Hayato Kawasaki, Settsu (JP); Kunihiro Nakano, Settsu (JP); Kenji Yamamoto, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 380 days.

(21) Appl. No.: 15/108,199

(22) PCT Filed: Dec. 22, 2014

(86) PCT No.: PCT/JP2014/083967
§ 371 (c)(1),
(2) Date: Jun. 24, 2016

(87) PCT Pub. No.: WO2015/098872
PCT Pub. Date: Jul. 2, 2015

(65) Prior Publication Data
US 2016/0329862 A1    Nov. 10, 2016

(30) Foreign Application Priority Data
Dec. 26, 2013  (JP) ................ 2013-268736

(51) Int. Cl.
*H02S 50/10* (2014.01)
*H01L 31/05* (2014.01)
(Continued)

(52) U.S. Cl.
CPC ...... *H02S 50/10* (2014.12); *H01L 31/022466* (2013.01); *H01L 31/05* (2013.01); *H01L 31/1804* (2013.01); *H01L 31/068* (2013.01)

(58) Field of Classification Search
CPC ....................................................... H02S 50/10
See application file for complete search history.

(56) References Cited

U.S. PATENT DOCUMENTS

| | | |
|---|---|---|
| 2009/0235972 A1 | 9/2009 | Fukushima et al. |
| 2011/0308728 A1 | 12/2011 | Fukushima et al. |

(Continued)

FOREIGN PATENT DOCUMENTS

| | | |
|---|---|---|
| JP | 2005303085 A | 10/2005 |
| JP | 2007201331 A | 8/2007 |

(Continued)

OTHER PUBLICATIONS

English machine translation of JP 2013-195142 A provided by the EPO. (Year: 2018).*

(Continued)

*Primary Examiner* — Devina Pillay
*Assistant Examiner* — Daniel P Malley, Jr.
(74) *Attorney, Agent, or Firm* — Alleman Hall Creasman & Tuttle LLP

(57) ABSTRACT

An I-V measurement method is provided for a solar cell having a collecting electrode on the first surface side of a single-crystalline silicon substrate of a first conductivity type and having a transparent electrode on the outermost surface on the second surface side of the single-crystalline silicon substrate of the first conductivity-type. An electric current is supplied to the solar cell in a state in which flexible metal foil and the transparent electrode are brought into detachable contact with each other such that the flexible metal foil follows undulations of the single-crystalline sili- (Continued)

con substrate of a first conductivity type, and the first surface is set as a light-receiving surface. It is preferable that at least on a portion that is in contact with the transparent electrode, the metal foil is formed of at least one selected from the group consisting of Sn, Ag, Ni, In, and Cu.

16 Claims, 3 Drawing Sheets

(51) Int. Cl.
*H01L 31/0224* (2006.01)
*H01L 31/18* (2006.01)
*H01L 31/068* (2012.01)

(56) References Cited

U.S. PATENT DOCUMENTS

| 2011/0308729 | A1 | 12/2011 | Fukushima et al. |
| 2012/0032694 | A1* | 2/2012 | Hinkle ............ H02S 50/10 324/750.01 |
| 2012/0192914 | A1 | 8/2012 | Fujishima et al. |
| 2013/0056152 | A1 | 3/2013 | Fukushima et al. |
| 2014/0239997 | A1 | 8/2014 | Higuchi et al. |
| 2014/0373339 | A1* | 12/2014 | Mori ............ H01L 31/0504 29/593 |

FOREIGN PATENT DOCUMENTS

| JP | 2013150005 A | | 8/2013 |
| JP | 2013195142 A | * | 9/2013 |
| JP | 2013195142 A | | 9/2013 |
| TW | 201337282 A | | 9/2013 |
| WO | 2011034145 A1 | | 3/2011 |

OTHER PUBLICATIONS

ISA Japanese Patent Office, International Search Report Issued in Application No. PCT/JP2014/083967, dated Mar. 17, 2015, WIPO, 7 pages.

International Bureau of WIPO, International Preliminary Report on Patentability Issued in Application No. PCT/JP2014/083967, dated Jul. 7, 2016, WIPO, 8 pages.

* cited by examiner

I-V MEASUREMENT DEVICE FOR SOLAR CELL, MANUFACTURING METHOD FOR SOLAR CELL, AND SOLAR CELL MODULE

TECHNICAL FIELD

The present invention relates to an I-V measurement method for solar cell, an I-V measurement device for solar cell, a manufacturing method for solar cell, a manufacturing method for solar cell module, and a solar cell module.

BACKGROUND ART

Crystalline silicon solar cells produced using a crystalline silicon substrate have high photoelectric conversion efficiency, and have already been widely put into practical use as solar photovoltaic power generation systems. Among them, a crystalline silicon solar cell in which a silicon-based thin-film having a gap different from that of single-crystalline silicon is formed on a surface of a single-crystalline silicon substrate to form a semiconductor junction is called a heterojunction solar cell. Among heterojunction solar cells, a solar cell in which a thin intrinsic silicon-based thin-film layer is interposed between a conductive silicon-based thin-film layer as an emitter or a base and a surface of a crystalline silicon substrate is one of forms of crystalline silicon solar cells having the highest conversion efficiency. It is known that when a thin intrinsic silicon-based thin-film layer is formed between a surface of a crystalline silicon substrate and a conductive silicon-based thin-film layer, surface defects on the crystalline silicon substrate are terminated to improve conversion efficiency.

In heterojunction solar cells, similarly to other solar cells, metal electrodes (collecting electrode on the light-receiving side, and back side metal electrode on the back side) are provided, and carriers generated in crystalline silicon are collected. A transparent electrode formed of a transparent conductive oxide (TCO) etc. is inserted between the conductive silicon-based thin-film layer and the metal electrode.

Thus, in a heterojunction solar cell, a conductive silicon-based thin-film layer formed on a surface of a crystalline silicon substrate and a metal electrode are not in direct contact with each other, and therefore formation of a recombination center due to diffusion of metal elements from the metal electrode is prevented to maintain quality of passivation (termination of surface defects) by an intrinsic silicon-based thin-film.

One of the problems of crystalline silicon solar cells is that the cost of metal electrode materials is high. Particularly in heterojunction solar cells, an amorphous conductive silicon-based thin-film layer is used, and therefore the allowable temperature in junction is low, so that conditions for sintering metal electrode materials are constrained. For securing sufficient conductivity, a large amount of metal electrode materials are needed, leading to a further increase in cost.

Since the influence of a shadowing loss is negligible on the back side, an attempt has been made to increase the area of a back side metal electrode by, for example, forming the back side metal electrode over the entire back surface. For example, when a black colored back sheet which is favored in terms of an external appearance is used as a back sheet for a solar cell module, light arriving at the back side cannot be made to reenter a solar cell by reflection of the light at the back sheet. Accordingly, it is effective to form a back side metal electrode over the entire surface of a back side transparent electrode in the solar cell so that light arriving at the back side is reflected at the interface between the back side transparent electrode and the back side metal electrode, and completing the reflection within a cell to confine the light. When a back side metal electrode is formed over the entire back surface as described above, the use amount of a back side metal electrode material tends to increase, leading to an increase in cost. Accordingly, it is desired to reduce the material cost of the back side metal electrode.

In mass production of solar cells, a plurality of solar cells include good products and defective produces. Conventionally, good products and defective products are judged by applying a current to measure solar cell characteristics (current-voltage characteristics (also referred to as I-V characteristics)) using solar cells after formation of a collecting electrode on the light-receiving side and a back side metal electrode on the back side. For example, Patent Document 1 discloses a method for measuring the electrical characteristics of a solar cell after formation of a collecting electrode on the light-receiving side and a back side metal electrode.

Patent Document 2 discloses bonding a metal plate or a metal foil to a back side collecting electrode (Ag paste) or a back side transparent electrode of a solar cell with an electroconductive adhesive containing Ag fine particles etc. Patent Document 2 mentions that damage by an external force during transportation, stress in the process for sealing a filler or the like as in conventional processes can be suppressed with the above mentioned structure, when a tab line and back side collecting electrode are joined together to modularize the solar cell.

PRIOR ART DOCUMENTS

Patent Documents

Patent Document 1: JP A 2013-195142
Patent Document 2: JP A 2007-201331

SUMMARY OF THE INVENTION

Problems to be Solved by the Invention

When good products and defective products are discriminated using a conventional measurement method as in Patent Document 1, it is necessary to judge good products and defective products after formation of a high-cost back side metal electrode. When a solar cell is judged as a defective product, a back side metal electrode material used therein cannot be reused, and thus there is a problem from the viewpoint of production costs.

Patent Document 2 discloses that an electroconductive adhesive on a back side collecting electrode, and a metal plate etc. can be used as they are for a collecting electrode. However, since an electroconductive paste used as an electroconductive adhesive contains a resin material, it is necessary to use a large amount of materials for reducing resistance to increase material cost. In addition, production cost issue with respect to an electroconductive paste used in a defective solar cell still remains.

In view of the above-mentioned situations, an object of the present invention is to provide an I-V measurement method for a solar cell, which can contribute to reduction of production costs.

Means for Solving the Problems

The inventors have found that I-V measurement for a solar cell can be easily performed by bringing a transparent electrode before formation of a metal electrode and a specific metal foil into contact with each other, and leading to the present invention.

The present invention relates to an I-V measurement method for a solar cell in which the solar cell includes a collecting electrode on the first surface side of a single-crystalline silicon substrate of a first conductivity-type, and a transparent electrode on an outermost surface on the second surface side of the single-crystalline silicon substrate of a first conductivity-type. In the I-V measurement method for a solar cell according to the present invention, the first surface is set as a light-receiving surface, a flexible metal foil and the transparent electrode are brought into detachable contact with each other so as to follow the undulations of the single-crystalline silicon substrate of a first conductivity-type. In this state, a current is supplied to the solar cell to perform I-V measurement. Preferably, at least a portion of the metal foil which is in contact with the transparent electrode is formed of at least one selected from the group consisting of Sn, Ag, Ni, In and Cu.

Preferably, the metal foil includes a first metal foil with a contact metal layer formed on a surface of a metal base material, and the contact metal layer is formed of at least one selected from the group consisting of Sn, Ag, Ni, In and Cu. Preferably, the metal foil is disposed in such a manner that the contact metal layer faces the transparent electrode, the contact metal layer and the transparent electrode are brought into detachable contact with each other, and in this state, I-V measurement is performed. More preferably, the metal foil further includes at least a second metal foil on a side opposite to the transparent electrode side of the first metal foil.

In a state in which the metal foil and the transparent electrode are in detachable contact with each other, regions constituting 80% or more and less than 100% of the projected area of the surface of the transparent electrode may have gap portions between the transparent electrode and the metal foil.

The thickness of the metal foil is preferably 4 to 190 μm.

The present invention also relates to an I-V measurement device for a solar cell including a collecting electrode on the first surface side of a single-crystalline silicon substrate of a first conductivity-type, and a transparent electrode on an outermost surface on the second surface side of the single-crystalline silicon substrate of a first conductivity-type. The I-V measurement device for a solar cell according to the present invention includes an I-V measurement section including a flexible metal foil. In the I-V measurement section, the first surface is set as a light-receiving surface, the metal foil and the transparent electrode are brought into detachable contact with each other so as to follow the undulations of the single-crystalline silicon substrate of a first conductivity-type, and in this state, a current is supplied to the solar cell to perform I-V measurement. Preferably, at least a portion of the metal foil which is in contact with the transparent electrode is formed of at least one selected from the group consisting of Sn, Ag, Ni, In and Cu.

Preferably, the I-V measurement section further includes a rigid metal plate on a side opposite to the transparent electrode side of the metal foil, the metal foil includes an opening section extending through the metal foil toward the metal plate side, and the metal plate has a suction hole which overlaps the opening section. It is preferable that in the I-V measurement section, the metal foil and the transparent electrode are brought into detachable contact with each other by suctioning the solar cell via the opening section of the metal foil from the suction hole of the metal plate, and in this state, I-V measurement is performed.

Preferably, the metal foil has a plurality of the opening sections, and the metal plate has a plurality of the suction holes.

The opening section of the metal foil is preferably larger than the suction hole of the metal plate.

Preferably, the metal foil includes a first metal foil with a contact metal layer formed on a surface of a metal base material, and the contact metal layer is formed of at least one selected from the group consisting of Sn, Ag, Ni, In and Cu. It is preferable that in the I-V measurement section, the metal foil is disposed in such a manner that the contact metal layer faces the transparent electrode, the contact metal layer and the transparent electrode are brought into detachable contact with each other, and in this state, I-V measurement is performed. More preferably, the metal foil further includes at least a second metal foil on a side opposite to the transparent electrode side of the first metal foil.

The thickness of the metal foil is preferably 4 to 190 μm.

Further, the present invention relates to a manufacturing method for a solar cell, the method including the steps of: providing a solar cell including a collecting electrode on the first surface side of a single-crystalline silicon substrate of a first conductivity-type, and a transparent electrode on an outermost surface on the second surface side of the single-crystalline silicon substrate of a first conductivity-type; performing I-V measurement of the solar cell by the I-V measurement method; and judging whether the solar cell is a good product or a defective product based on the I-V measurement result and predetermined criteria, in this order.

Preferably, a metal electrode is formed on the transparent electrode on the second surface side for only the solar cell judged as a good product in the step of judging whether the solar cell is a good product or a defective product.

Further, the present invention relates to a manufacturing method for a solar cell module. The method includes producing a solar cell by the above-mentioned production method, connecting a plurality of the solar cells, and sealing the solar cells with a sealing material.

Effects of the Invention

According to the present invention, a transparent electrode and a metal foil are brought into contact with each other, so that I-V measurement of the solar cell can be performed even when a solar cell before formation of a metal electrode is used, and thus whether the solar cell is a good product or a defective product can be judged. Defective products can be excluded without carrying out a metal electrode formation process using a metal electrode material, and therefore a loss of the metal electrode material in relation to defective products can be suppressed to considerably reduce the material cost in mass production of solar cells.

DESCRIPTION OF EMBODIMENTS

Figure 1:
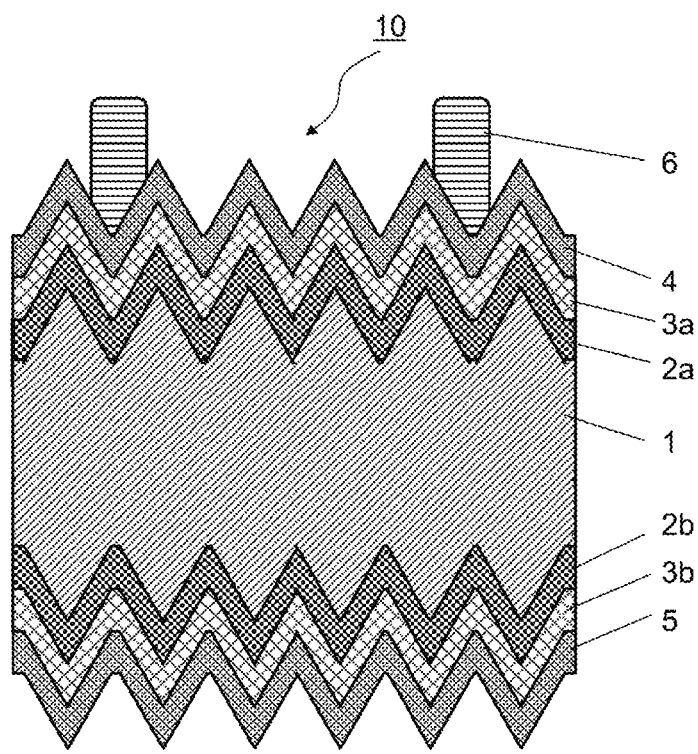
FIG. 1 is a schematic view showing one example of a solar cell to be used in I-V measurement in the present invention.

Hereinafter, embodiments of the present invention will be described in detail with reference to the drawings. The present invention is not limited to these embodiments.

An I-V measurement method for a solar cell according to the present invention is a method in which a solar cell including a collecting electrode on the first surface side of a single-crystalline silicon substrate of a first conductivity-type, and a transparent electrode on an outermost surface of the second surface side of the single-crystalline silicon substrate of a first conductivity-type is provided. The first surface is set as a light-receiving surface, a flexible metal foil and the transparent electrode are brought into detachable contact with each other so as to follow the undulations of the single-crystalline silicon substrate of a first conductivity-type, and in this state, a current is supplied to the solar cell to perform I-V measurement.

An I-V measurement device of a solar cell according to the present invention includes an I-V measurement section including a flexible metal foil. In the I-V measurement section, the first surface is set as a light-receiving surface, the metal foil and the transparent electrode are brought into detachable contact with each other so as to follow the undulations of the single-crystalline silicon substrate of a first conductivity-type, and in this state, a current is supplied to the solar cell to perform I-V measurement.

In this specification, the solar cell means not only a finished product, but also an in-process product in the course of production. The solar cell to be used in I-V measurement in the present invention means an in-process solar cell product in which formation of the collecting electrode on the first surface side (light-receiving side) of the substrate is completed, and the outermost surface on the second surface side (back side) is covered with the transparent electrode.

In the present invention, I-V measurement is performed with the first surface of the substrate being set as a light-receiving surface and the second surface of the substrate being set as a back surface. However, when a patterned metal electrode is formed on the second surface side after the I-V measurement, the first surface side may be either a light-receiving side or a back side in a finished solar cell product after formation of the metal electrode. In the following descriptions of I-V measurement, the first surface side is a light-receiving side, and the second surface side is a back side.

Usually, I-V measurement is performed for a solar cell including a collecting electrode on the light-receiving side and a metal electrode on the back side. It is extremely difficult to perform an I-V measurement for an in-process solar cell product which does not include a metal electrode on the back side. This is because the transparent electrode has extremely lower carrier density than a metal and thus the contact resistance is high. On the back side of the solar cell, a height difference (undulations) of about 10 to 20 μm, which generates at the time of cutting a single-crystalline silicon substrate from an ingot, exists over the entire wafer. This height difference remains after formation of a texture by anisotropic etching, and therefore when a smooth and rigid metal plate (thickness: about 200 μm) is used, it is difficult to establish uniform contact with the back side transparent electrode over the entire wafer.

The inventors have found that by bringing the back side transparent electrode and the flexible metal foil into detachable contact with each other, the metal foil can be brought into uniform contact with the back side transparent electrode (i.e., the metal foil can be made to follow the undulations of the substrate), so that I-V measurement can be performed before the metal electrode on the back side is formed.

In this specification, the "state in which the metal foil and the transparent electrode are brought into detachable contact with each other" means a state in which the metal foil and the transparent electrode are brought into detachable contact with each other by applying a pressure, typically by pressing, suction or the like. Accordingly, a state in which the metal foil and the transparent electrode are bonded to each other by curing of a pressure sensitive adhesive, solidification of melt solder, or the like does not correspond to the "state in which the metal foil and the transparent electrode are brought into detachable contact with each other". A state in which the metal electrode is formed on the transparent electrode by printing, plating, sputtering or the like does not correspond to the "state in which the metal foil and the transparent electrode are brought into detachable contact with each other".

FIG. 1 shows one example of a solar cell (heterojunction solar cell) to be used in I-V measurement of the present invention. A solar cell 10 shown in FIG. 1 includes a collecting electrode 6 on the light-receiving side of a single-crystalline silicon substrate of a first conductivity-type 1, and a transparent electrode 5 on an outermost surface on the back side. Preferably, the solar cell 10 includes an intrinsic silicon-based thin-film layer 2a, a silicon-based thin-film layer of an opposite-conductivity-type 3a and a transparent electrode 4, in this order from the substrate side between the single-crystalline silicon substrate of the first conductivity-type 1 and the collecting electrode 6 on the light-receiving side. Preferably, the solar cell 10 includes an intrinsic silicon-based thin-film layer 2b and a silicon-based thin-film layer of the first conductivity-type 3b, in this order from the substrate side between the single-crystalline silicon substrate of the first conductivity-type 1 and the transparent electrode 5 on the back side. The silicon-based thin-film layer of the opposite-conductivity-type 3a and the silicon-based thin-film layer of the first conductivity-type 3b may be replaced with each other. In this specification, the "first conductivity-type" means any one of n-type or p-type, and the "opposite conductivity-type" means p-type when the first conductivity-type is n-type, or n-type when the first conductivity-type is p-type.

The collecting electrode on the light-receiving side can be formed by a known method, and is preferably patterned in a shape such as a comb-like pattern. In the present invention, the collecting electrode on the light-receiving side may be conductive to the extent that I-V measurement can be performed. For example, when a finished solar cell product includes an underlying electrode layer and a plating layer thereon as a collecting electrode on the light-receiving side, I-V measurement may be performed using a solar cell after formation of an underlying layer for plating and before formation of a plating layer, followed by forming a plating layer.

In the present invention, the back side transparent electrode is formed on preferably 90% to 100%, more preferably 94% to 100%, especially preferably 96% to 100% of the area of the back surface of the single-crystalline silicon substrate of a first conductivity-type.

As the transparent electrode on the light-receiving side and the back side, a thin-film formed of a transparent conductive metal oxide such as, for example, indium oxide, tin oxide, zinc oxide, titanium oxide or a composite oxide thereof is generally used. Particularly, an indium-based composite oxide mainly composed of indium oxide is preferable. An indium tin composite oxide (ITO) is especially preferably used from the viewpoint of high conductivity and transparency.

Preferably, an n-type single-crystalline silicon substrate is used as the single-crystalline silicon substrate of a first conductivity-type 1. Preferably, one having a textured structure on a surface of the single-crystalline silicon substrate of a first conductivity-type 1 as shown in FIG. 1 is used.

Figure 2:
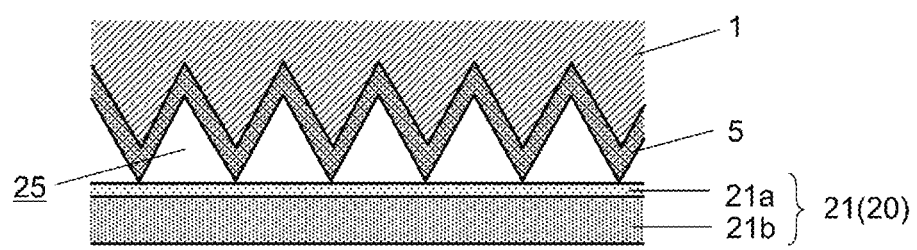
FIG. 2 is a schematic sectional view showing a structure on the back side according to one embodiment of the present invention.

FIG. 2 is a schematic view of a structure in which a back side transparent electrode and a metal foil are in contact with each other in a solar cell according to one embodiment of the present invention.

In the solar cell shown in FIG. 2, a transparent electrode 5 is formed as an outermost surface layer on the back side of the single-crystalline silicon substrate of a first conductivity-type 1. In the solar cell shown in FIG. 2, the intrinsic silicon-based thin-film layer 2b and the silicon-based thin-film layer of a first conductivity-type 3b which are shown in FIG. 1 are omitted for simplification of explanation (the same applies to the subsequent drawings).

In the embodiment shown in FIG. 2, a first metal foil 21 with a contact metal layer 21a formed on a surface of a metal base material 21b is used as a metal foil 20, and the contact metal layer faces the transparent electrode 5. In this embodiment, the transparent electrode 5 and the contact metal layer 21a are in detachable contact with each other to the extent that I-V measurement can be performed. The solar cell may have irregularity structures on a surface on the back side, where at least some of the projected portions in the irregularity structures bite into the metal foil 20 (contact metal layer 21a).

Preferably, a first metal foil with a contact metal layer formed on a surface of a metal base material is used as the metal foil as shown in FIG. 2. Preferably, a metal having low contact resistance with the transparent electrode, or a flexible metal is used here as the contact metal layer. By bringing such a contact metal layer into detachable contact with the back side transparent electrode, contact resistance can be reduced, so that I-V measurement can be easily performed.

At least some of the recessed portions on a surface on the back side may have gap portions between the metal foil and the transparent electrode in a state in which the metal foil and the transparent electrode are in contact with each other. In FIG. 2, gap portions 25 exist between the contact metal layer 21a and the transparent electrode 5. In the present invention, I-V measurement of the solar cell can be performed even when gap portions exist between the metal foil and the transparent electrode. Here, regions constituting 80% or more and less than 100% of the projected area of the surface of the back side transparent electrode may have gap portions between the transparent electrode and the metal foil (or between the transparent electrode and the contact metal layer). Since the surface cleanliness of the transparent electrode is improved as the contact between the metal foil and the transparent electrode decreases, gap portions may exist on regions constituting 85% or more and less than 100%, or 90% or more and less than 100% of the projected area of the surface of the back side transparent electrode, when processes of the back surface after I-V measurement are considered.

The "surface of the back side transparent electrode" means the entire exposed surface on the back side of the back side transparent electrode, or means the entire surface of irregularity structures when the irregularity structures exist on the surface. In other words, gap portions may be formed in 80% or more and less than 100% of the area, with more than 0% and 20% or less of the area being in contact with the metal foil (or contact metal layer). When dot-like buffer electrodes etc. exist on the back side transparent electrode as described later, regions other than a region where the buffer electrodes are formed correspond to the "surface of the back side transparent electrode".

Preferably, at least a portion of the metal foil, which is in contact with the transparent electrode, is formed of a metal having low contact resistance with the transparent electrode, or a flexible metal. For example, when the metal foil includes a contact metal layer and a metal base material, the material of the contact metal layer is preferably a metal having low contact resistance with the transparent electrode, or a flexible metal is used here as the contact metal layer. Examples of the metal having low contact resistance include Ag, Ni and Au, and examples of the flexible metal include Sn, Cu, In and Al. Preferably, a material selected from at least one of Sn, Ag, Ni, In and Cu among the above-mentioned metals is used in the present invention. Among them, Ag is preferably used because it has a high reflectance, so that a current value close to that in a completely finished cell product can be predicted. As the contact metal layer, one obtained by laminating a metal having low contact resistance and a flexible metal may be used.

As the metal foil, preferably one having a thickness of 4 to 190 µm, more preferably one including a contact metal layer as described above is used. That is, the metal foil may be formed of only a contact metal layer, or may have a structure in which a contact metal layer is formed on a surface of a metal base material. Particularly, for reducing the cost, it is preferable to use a metal foil having a structure in which an expensive and thin contact metal layer is combined with a metal base material which is inexpensive and has moderate strength and flexibility. The material of the metal base material is preferably a metallic material which is inexpensive and has high processability, such as stainless steel, Cu or Al.

The thickness of the metal foil is preferably 5 to 100 µm, further preferably 7 to 55 µm, especially preferably 8 to 50 µm. By using a metal foil having a thickness in the above-mentioned range, it can be expected to secure more uniform contact with the transparent electrode and moderate strength of the metal foil.

When a metal foil with a contact metal layer formed on a surface of a metal base material is used, the thickness of the contact metal layer is preferably 0.01 to 2 µm, more preferably 0.05 to 0.8 µm. By using a contact metal layer having a thickness in the above-mentioned range, moderate flexibility in a microscopic range and proper electrical contact with the back side transparent electrode can be expected.

As described later, a monolayer metal foil, or a metal foil having a plurality of layers stacked on one another may be used as the metal foil. When a metal foil having a plurality of layers is used, it is preferable that the metal foil includes a first metal foil with a contact metal layer formed on a surface of a metal base material, and a second metal foil on a side opposite to the transparent electrode side of the first metal foil. The metal foil may include a third metal foil, a fourth metal foil, and so on in addition to the first metal foil and the second metal foil. When a metal foil having a plurality of layers is used, the first metal foil is not limited to a structure in which a contact metal layer is formed on a surface of a metal base material, and the first metal foil may be composed only of a contact metal layer.

In this description, the simple term "metal foil" means the first metal foil when the metal foil is composed only of the first metal foil (monolayer), and means the total of a plurality of layers when the metal foil includes a plurality of layers including the first metal foil, the second metal foil and so on.

The solar cell to be used in I-V measurement in the present invention is a crystalline silicon solar cell including a single-crystalline silicon substrate. Preferably, a solar cell having a surface provided with fine pyramid-like irregularity structures of about 2 to 10 μm, which are constituted of the (111) silicon surface and formed by anisotropic etching of single-crystalline silicon, is used. In the present invention, mainly apex portions (projected portions) in fine pyramid-like irregularity structures are brought into detachable contact with the metal foil (or contact metal layer) at the time when the back side transparent electrode comes into contact with the metal foil (or contact metal layer), so that an electrical contact can be obtained. It is preferable that the irregularity structures are formed on the back surface of the solar cell, and it is more preferable that the irregularity structures are also formed on the light-receiving side surface of the solar cell.

In the present invention, an I-V measurement device including an I-V measurement section having the above-mentioned metal foil is preferably used in I-V measurement. When the I-V measurement device is used, I-V measurement is preferably performed using a flexible metal foil in combination with a rigid metal plate.

The metal plate to be used in the I-V measurement device is rigid unlike the above-mentioned flexible metal foil. The thickness of the metal plate is preferably 5 to 50 mm, more preferably 10 to 40 mm. The material of the metal plate is, for example, stainless steel, Cu, Al or the like, which may be covered with Au etc.

The metal plate to be used in the I-V measurement device is preferably a smooth metal plate. The "smooth metal plate" means a metal plate having a surface roughness (Ra) of 1 μm or less. The surface roughness (Ra) can be measured by atomic force microscopy (AFM), profilometry or the like.

Figure 3A:
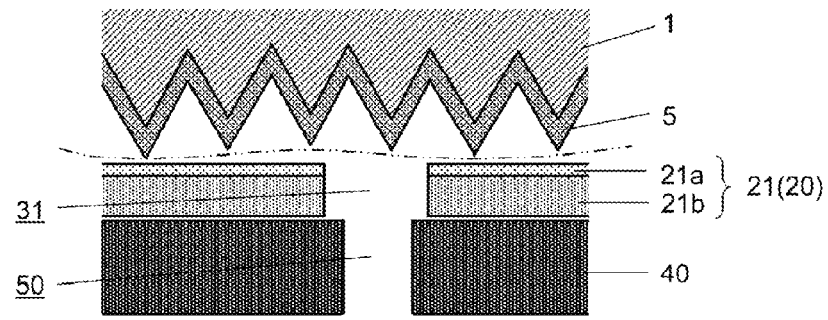
FIGS. 3A and 3B are schematic sectional views each showing an I-V measurement device according to one embodiment of the present invention.
Figure 3B:
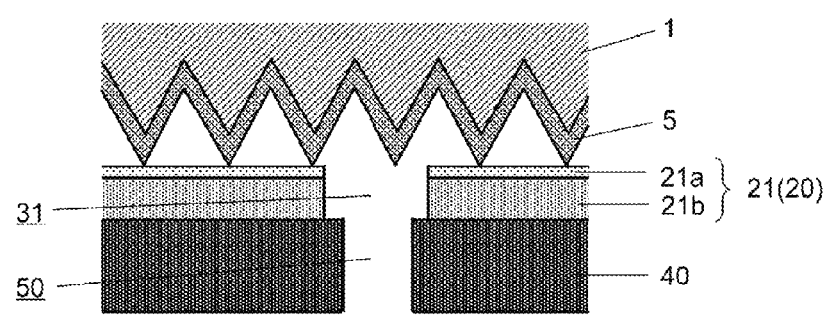

FIGS. 3A and 3B are schematic sectional views each showing an I-V measurement device according to one embodiment of the present invention. In the embodiment shown in FIGS. 3A and 3B, a first metal foil 21 with a contact metal layer 21a formed on a surface of a metal base material 21b, which faces the transparent electrode 5, is used as a metal foil 20. A metal plate 40 is disposed on the metal base material 21b side of the first metal foil 21, and the contact metal layer 21a is disposed on a surface of the first metal foil 21, which faces the transparent electrode 5.

In I-V measurement, it is preferable that as shown in FIGS. 3A and 3B, the first metal foil 21 has a first opening section 31, and the metal plate 40 has a suction hole 50 which overlaps the first opening section 31. By disposing the solar cell to be measured in the order of solar cell/metal foil/metal plate, and suctioning the solar cell via the first opening section 31 from the suction hole 50, the back side transparent electrode 5 of the solar cell can be pressed against the contact metal layer 21a of the first metal foil 21 which serves as a probe, so that a contact can be obtained.

As described above, a height difference (undulations) generated at the time of cutting out the single-crystalline silicon substrate exists on the back side of the solar cell. As shown in FIG. 3A, in a state in which the solar cell is not suctioned, the metal foil 20 (first metal foil 21) is not pressed against the metal plate 40, and therefore the most part of the metal foil 20 retains a non-contact margin of about several μm to several hundred μm. On the other hand, when the solar cell is suctioned as shown in FIG. 3B, the metal foil 20 is pressed against the metal plate 40 by the solar cell. Here, since the metal foil 20 has flexibility, a restoring force is generated, and thus contact between the back side transparent electrode 5 of the solar cell and the contact metal layer 21a of the first metal foil 21 becomes uniform throughout the surface of the solar cell, so that a proper contact is obtained.

In I-V measurement, the solar cell is not suctioned as strongly as in pressure-sealing during modularization, but in the present invention, contact quality between the metal foil (or contact metal layer) and the transparent electrode can be secured by using the above-mentioned metal foil. Preferably, a first metal foil with a contact metal layer formed on a surface of a metal base material is used here as the metal foil. As described later, the metal foil may include a second metal foil and so on in addition to the first metal foil.

Examples of the method for suctioning a solar cell include a method in which a line connected to a suction hole is suctioned by a pump etc. When the solar cell is suctioned by a pump, it can be suctioned with a pressure of, for example, 10 to 90 kPa.

In suction of the solar cell, the first opening section of the first metal foil is preferably larger than the suction hole of the metal plate. Accordingly, in suction of the solar cell, only the solar cell can be suctioned without causing a loss of suctioning pressure between the metal foil and the metal plate.

Preferably, a metal foil having a plurality of layers including those other than the first metal foil is used as the metal foil for further improving the restoring force of the metal foil. In the embodiment shown in FIG. 4, a metal foil 220 includes a second metal foil 22 between the first metal foil 21 and the metal plate 40. Accordingly, the above-mentioned non-contact margin of the metal foil increases, so that the contact pressure in the surface of the solar cell is made further uniform. The metal foil may include other metal foils (third metal foil, fourth metal foil and so on) in addition to the second metal foil between the first metal foil and the metal plate. Metal foils other than the first metal foil may be monolayer, or stack of two or more layers. The first metal foil is not limited to a structure in which a contact metal layer is formed on a surface of a metal base material, and the first metal foil may be composed only of a contact metal layer.

The second metal foil (or third metal foil etc.) is not in direct contact with the transparent electrode, and therefore may be made of the same material as that of the metal base material of the first metal foil. For example, an Al foil etc. may be used as the second metal foil (or third metal foil etc.). It is preferable that in the second metal foil (or third metal foil etc.), a coating is formed on the above-mentioned material. The coating may be made of a material such as Au, which hardly undergoes a solid-phase reaction with the material metal of the metal base material of the first metal foil, is hardly oxidized, and has relatively satisfactory contact quality.

Figure 4:
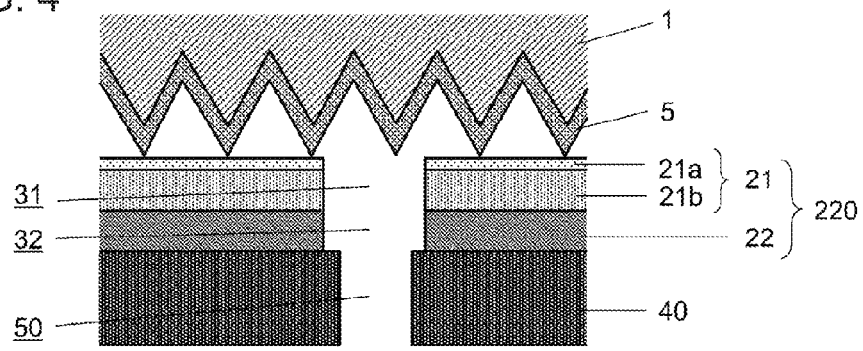
FIG. 4 is a schematic sectional view showing an I-V measurement device according to another embodiment of the present invention.

Preferably, the second metal foil (or third metal foil) has a second opening section (or third opening section etc.) which overlaps the first opening section of the first metal foil and the suction hole of the metal plate. For example, it is preferable that the second metal foil 22 has a second opening section 32 which overlaps the first opening section 31 of the first metal foil 21 and the suction hole 50 of the metal plate 40 when the metal foil 220 includes the first metal foil 21 and the second metal foil 22, as shown in FIG. 4. It is preferable that the second metal foil and the third metal foil have a second opening section and a third opening section, respectively, which overlap the first opening section of the first metal foil and the suction hole of the metal plate when the metal foil includes the first metal foil, the second metal foil and the third metal foil.

The "suction hole which overlaps the first opening section (or the second opening section which overlaps the opening section of the first metal foil and the suction hole of the metal plate, etc.)" means a state in which at a cross-section vertical to the substrate, the first opening section and the suction hole at least partially overlap each other (or the first opening section, the suction hole, the second opening section and so on partially overlap one another) to provide a pierced opening region.

In this description, the simple term "opening section" means the opening section of the first metal foil when the metal foil is composed only of the first metal foil, and means the opening sections of all layers when the metal foil includes a plurality of layers.

Figure 5:
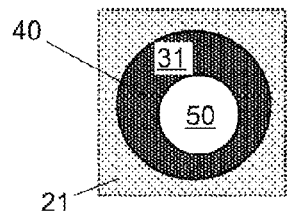
FIG. 5 is a schematic plan view showing one example of a suction hole and an opening section.

When the metal foil has two or more layers, the opening section of the metal foil is preferably larger than the suction hole of the metal plate. Specifically, when the metal foil includes the second metal foil and so on, it is preferable that each of the first opening section of the first metal foil and the opening sections of other metal foils is larger than the suction hole of the metal plate. Here, it is preferable that as shown in FIG. 5, the suction hole 50 of the metal plate 40 exists in the opening section of the metal foil (the first opening section 31 of the first metal foil 21 in FIG. 5) in plan view of the substrate from the light incident side. It is considered that accordingly, influences on the overlap between the suction hole and the opening section by deformation and distortion of the metal foil can be reduced, so that suction of the metal foil to the metal plate can be suppressed. Although the size of the second opening section etc., is preferably equal to the size of the first opening section, these opening sections may have mutually different sizes. When the opening sections have mutually different sizes, it is preferable that the first opening section is the largest, and an opening section closer to the metal plate is smaller (it is to be noted that all the opening sections are larger than the suction hole).

In the present invention, it is preferable that the metal plate in the I-V measurement device has a plurality of suction holes. The distance between the suction holes is preferably 0.4 cm to 3 cm, more preferably 0.4 cm to 1 cm. The suction pressure can also be made uniform by reducing the distance between the suction holes to increase the density. Here, a contact region between the back side transparent electrode and the metal foil does not exist in a section corresponding to the suction hole, and therefore the shape of the suction hole is not limited. A circular shape is preferable. When the suction hole has a circular shape, the diameter is preferably about 300 to 1500 μm, and the area is preferably 0.07 mm$^2$ or more and 2 mm$^2$ or less.

Preferably, the metal foil has an opening section in a region corresponding to the suction hole of the metal plate for suctioning the solar cell. Preferably, the metal foil has a plurality of opening sections when the metal plate has a plurality of suction holes. In either case, the diameter of the opening section is preferably larger by about 10 to 30% than the diameter of the suction hole for improving the conductance between the suction hole and the solar cell. The cycle at which the suction hole and the opening section are provided is not particularly limited as long as it is in such a range that the solar cell can be uniformly suctioned. It is preferable that the suction hole and the opening section are disposed at a cycle of 5 mm or more and 30 mm or less for securing the effective area of the metal plate.

In the present invention, I-V measurement is performed for a solar cell prepared in this manner, and a metal electrode is formed on the second surface side (back side in I-V measurement) to manufacture a solar cell. Such a manufacturing method of a solar cell is also a part of the present invention.

The manufacturing method for a solar cell according to the present invention includes step of providing a solar cell having a collecting electrode on the first surface side of a single-crystalline silicon substrate of a first conductivity-type and having a transparent electrode on an outermost surface on the second surface side of the single-crystalline silicon substrate of a first conductivity-type, step of performing I-V measurement of the solar cell by the above mentioned method, and step of judging whether the solar cell is a good product or a defective product based on the I-V measurement result and predetermined criteria, in this order.

In the manufacturing method for a solar cell according to the present invention, it is preferable that a metal electrode is formed on the transparent electrode on the second surface side for only the solar cell judged as a good product in the step of judging whether the solar cell is a good product or a defective product.

As described above, in conventional techniques, it is necessary to perform I-V measurement, etc. for a solar cell in which a metal electrode on the second surface side (back side in I-V measurement) is already formed for judging the performance of the solar cell, and thus it is necessary to finish the solar cell for judging whether it is a good product or a defective product. Thus, it is necessary to judge whether the solar cell is a good product or a defective product after formation of an expensive metal electrode, and therefore there is a problem in terms of production costs.

On the other hand, in the present invention, I-V measurement of a solar cell can be performed in a state before formation of a metal electrode on the second surface side, and it is possible to form a metal electrode on the second surface side for only a solar cell judged as a good product, so that a solar cell can be prepared at a lower cost.

In I-V measurement according to the present invention, whether the solar cell is a good product or a defective product can be judged based on the same criteria as those in I-V measurement for finished solar cell products produced by conventional methods. In I-V measurement according to the present invention, the open circuit voltage (Voc) tends to be comparable to I-V measurement result in conventional methods, the short circuit current (Isc) tends to be higher than I-V measurement result in conventional methods, and the fill factor (FF) tends to be lower than I-V measurement result in conventional methods. Preferably, good products and defective products are judged with the above-mentioned tendency taken into consideration. By using the measurement method according to the present invention, values comparable to those of a finished product can be obtained for the short circuit current (Isc), the open circuit voltage (Voc) and the fill factor (FF) although a metal electrode on the back side does not exist. For example, when the short circuit current (Isc) or the open circuit voltage (Voc) is lower than a threshold in this stage, the solar cell can be judged as a defective product. It is also possible to discriminate good products and defective products with the fill factor (FF) in this stage because the in-plane distribution of the lifetime (distribution of the voltage) and influences of local resistance due to breakage, etc. of a metal electrode on the front side are also reflected in this stage.

Preferably, a metal electrode is formed on the transparent electrode on the second surface side for only a solar cell judged as a good product.

The method for forming a metal electrode on the second surface side is not particularly limited. The metal electrode can be formed using a printing method, a sputtering method, a plating method, a vapor deposition method, a RPD method or the like. Particularly, from the viewpoint of productivity, it is preferable to form the metal electrode by a plating method or a sputtering method.

The metal electrode on the second surface side may be patterned in the shape of a comb-like pattern etc., or may not be patterned. For example, when a metal electrode is formed over substantially the entire surface of the transparent electrode on the second surface side, the second surface side corresponds to the back side in a finished solar cell product. On the other hand, when a patterned metal electrode is formed on the transparent electrode on the second surface side, the second surface side may correspond to either the back side or the light-receiving side in a finished solar cell product. For example, when a metal electrode is formed on the second surface side by printing etc., light can be entered from the second surface side by setting the second surface side as the light-receiving side.

Preferably, solar cells prepared in the manner described above are modularized when put into practical use. Solar cells are modularized by an appropriate method. For example, a bus bar of a collecting electrode is connected to an interconnector such as a tab line to connect a plurality of solar cells in series or in parallel, and the solar cells are sealed with a sealing material, a glass substrate and so on to perform modularization.

A metal foil used in I-V measurement and a back side transparent electrode are kept detachable contact, so that the metal foil can be used as a metal electrode. In other words, a finished solar cell product and a solar cell module can be prepared from a solar cell used in I-V measurement (in-process solar cell product) and a metal foil.

Thus, when a metal foil used in I-V measurement is used as a metal electrode, the finished solar cell product includes a collecting electrode on the light-receiving side of a single-crystalline silicon substrate of a first conductivity-type, and a back side transparent electrode of the single-crystalline silicon substrate of a first conductivity-type. The solar cell further includes a flexible metal foil, which is in detachable contact with the transparent electrode so as to follow the undulations of the single-crystalline silicon substrate of a first conductivity-type, on the outermost surface on the back side of the single-crystalline silicon substrate of a first conductivity-type. Preferably, at least a portion of the metal foil which is in contact with the transparent electrode is formed of at least one selected from the group consisting of Sn, Ag, Ni, In and Cu. In the solar cell module, the solar cell is sealed with a sealing material to hold a state in which the metal foil and the back side transparent electrode are in detachable contact with each other. Preferably, the solar cell is disposed between a light-receiving side protective material on the light-receiving side of the solar cell and a back side protective material on the back side in the solar cell module.

Figure 6:
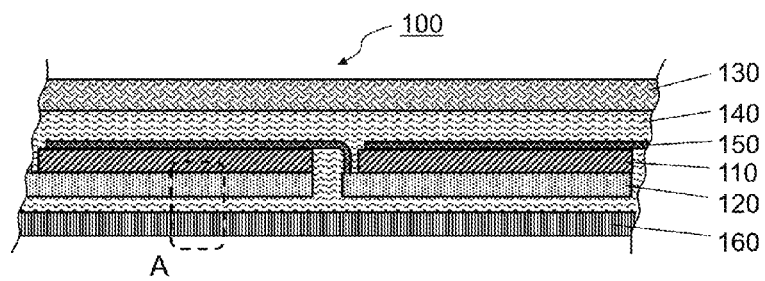
FIG. 6 is a schematic sectional view showing one example of a solar cell module including a metal foil.

In the finished solar cell product and the solar cell module according to this embodiment, a state in which a metal foil used in I-V measurement, and a back side transparent electrode are kept in detachable contact with each other is maintained, so that the metal foil can be used as a metal electrode on the back side of the solar cell. For example, as shown in FIG. 6, a plurality of solar cells connected via a tab line 150 are disposed between a light-receiving side protective material 130 and a back side protective material (back sheet 160), and sealed with a sealing material 140 to prepare a solar cell module 100. In modularization, vacuum-sealing is performed, and a pressure equivalent to atmospheric pressure is applied. An in-process solar cell product 110 (solar cell 10 used in I-V measurement) is pressed against a metal foil 120 for IC (interconnection) under atmospheric pressure, so that an electrical contact is obtained. As the metal foil 120 for IC, a metal foil having the same thickness, material and structure as in the case of I-V measurement is applied. As in the case of I-V measurement, the metal foil for IC may include a first metal foil with a contact metal layer formed on a surface of a metal base material, or have a plurality of layers including a second metal foil and so on in addition to the first metal foil. As the metal foil for IC, a metal foil used in I-V measurement may be used as it is after the I-V measurement, or a metal foil different from the metal foil used in I-V measurement may be used. When the metal foil is used as a metal electrode, it is preferable that the metal foil does not have an opening section.

Figure 7:
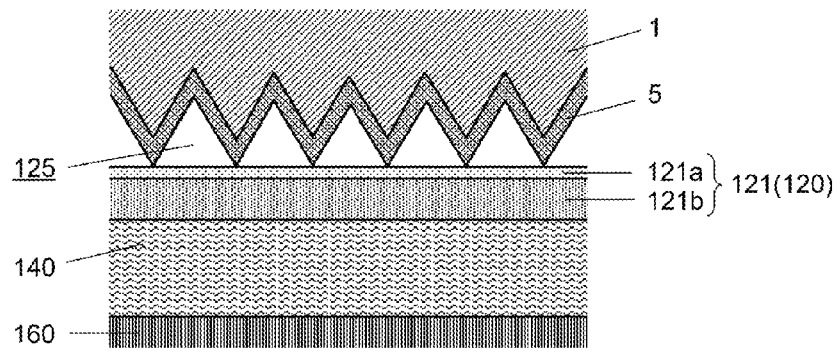
FIG. 7 is a schematic sectional view of the enlarged back side of one embodiment of a module structure.

FIG. 7 is a schematic sectional view of the enlarged dotted line region shown by symbol A in FIG. 6. In the embodiment shown in FIG. 7, the metal foil 120 includes a first metal foil 121 with a contact metal layer 121a formed on a surface of a metal base material 121b. As in the case of I-V measurement, the irregularity of the back side transparent electrode 5 of the solar cell is in detachable contact with the contact metal layer 121a on a surface of the metal foil 120 for IC in a microscopic level, so that an electrical contact is obtained. The contact state between the metal foil and the transparent electrode can be maintained by a pressure under which solar cells are sealed in preparation of the solar cell module. Since the back surface of the in-process solar cell product 110 and the surface of the metal foil 120 are in detachable contact with each other, stress generated by a difference in thermal expansion between the in-process solar cell product 110 and the metal foil 120 due to a temperature change is easily relaxed, so that excellent module reliability to a temperature change is obtained.

In this way, a finished solar cell product, and a solar cell module including the solar cell can be prepared.

In the solar cell module according to this embodiment, areas corresponding to the recessed portions of the irregularity surface on the back side may have gap portions between the metal foil and the transparent electrode. In FIG. 7, gap portions 125 exist between the contact metal layer 121a and the transparent electrode 5. Here, as in the case of the solar cell subjected to I-V measurement, regions constituting 80% or more and less than 100% of the projected area of the surface of the back side transparent electrode may have gap portions between the transparent electrode and the metal foil (or between the transparent electrode and the contact metal layer).

In FIG. 7, the inside of the solar cell module is filled with the sealing material 140, while the gap portions 125 surrounded by the back side transparent electrode 5 and the metal foil 120 for IC are not filled with the sealing material 140, and are thus kept in a low-pressure state. The low-pressure state in the gap portions 125 causes continuous application of a pressure to maintain the contact state between the contact metal layer 121a on the surface of the metal foil 120 for IC and the transparent electrode 5.

The gap portions are in a pneumatic condition before sealing while being in a state close to vacuum after sealing, and have a refractive index of about 1 to 1.05. When a gap portion exists, long-wavelength light having a wavelength of 950 nm or more among light incident from the front side of the solar cell mostly arrives at the back side. Some of the light beams are reflected at the interface between the back side transparent electrode and the gap portion, and returned into crystalline silicon that is a photoelectric conversion section of the solar cell. Other light beams are transmitted through the interface between the back side transparent electrode and the gap portion, reflected at the interface between the gap portion and the metal electrode on the back side, transmitted through the back side transparent electrode and the gap portion again, and absorbed in the solar cell.

As one of the important effects of this embodiment, plasmon absorption at the interface between the back side transparent electrode and the metal electrode does not occur because the metal electrode is not formed directly on the back side transparent electrode.

Usually, as a strategy for minimizing plasmon absorption at the interface between the back side transparent electrode and the metal electrode, the thickness of the back side transparent electrode is adjusted to 80 to 100 nm to maximize reflection at the interface between silicon and the transparent electrode. On the other hand, when a metal foil brought into physical contact with the back side is used as the metal electrode according to the present embodiment, plasmon absorption at the interface between the back side transparent electrode and the metal electrode can be suppressed. Therefore, the thickness of the back side transparent electrode can be considerably reduced to about 20 nm. Accordingly, absorption by the transparent electrode itself on the back side can be reduced, so that the current value can be further improved.

When the thickness of the back side transparent electrode decreases, mechanical damage to the apex of the irregularity of the transparent electrode may occur in the solar cell. It is preferable that dot-like buffer electrodes are disposed on the back side transparent electrode for further suppressing the mechanical damage.

Figure 8:
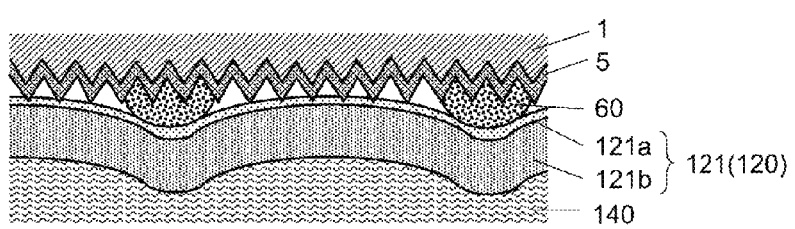
FIG. 8 is a schematic sectional view of the enlarged back side of another embodiment of a module structure.

FIG. 8 is a schematic view of the enlarged part in which the transparent electrode 5 and the metal foil 120 for IC are brought into contact with each other in preparation of a solar cell module with buffer electrodes 60 disposed on the back side transparent electrode 5. The metal foil 120 for IC includes a first metal foil 121 with a contact metal layer 121a formed on a surface of a metal base material 121b. When the buffer electrodes 60 are disposed, and a pressure is applied, firstly each of the buffer electrodes 60 and the contact metal layer 121a come into contact with each other, and the contact metal layer 121a is then pressed onto the transparent electrode 5 on which the buffer electrodes 60 do not exist. Since the pressure of the contact metal layer 121a is firstly received by the buffer electrodes 60, the pressure is made uniform in a region where the transparent electrode 5 on which the buffer electrodes 60 do not exist and the contact metal layer 121a are in contact with each other. Therefore, a local pressure is no longer applied to the transparent electrode 5, so that mechanical damage can be further reduced.

Preferably, the dot-like buffer electrodes are discretely disposed over an area constituting 0.2% or more and 1.5% or less of the back surface area of the back side transparent electrode. The height of the buffer electrode is preferably larger than the irregularity of the substrate. The height of the buffer electrode is preferably about 6 to 30 μm, more preferably about 10 to 25 μm from the viewpoint of a balance between reduction of the material cost and the buffering ability. The diameter of the buffer electrode is preferably about 10 to 100 μm, more preferably about 30 to 60 μm from the viewpoint of ease of securing utilization efficiency of materials and patterning uniformity. The distance between the buffer electrodes is preferably about 0.5 to 3 mm.

By disposing the buffer electrodes on the back side transparent electrode, mechanical damage is reduced, and a reduction in open circuit voltage (Voc) due to modularization is suppressed. Further, the pressure is made uniform, so that contact resistance becomes uniform to reduce series resistance, leading to improvement of the fill factor (FF).

As a material of the dot-like buffer electrode, for example, a paste obtained by mixing fine particles formed of a material such as Sn, Ag, Ni, Al, Cu or carbon and a binder such as epoxy or PVDF can be used, and it is preferable to use fine particles formed of at least one of Sn, Ag and Ni from the viewpoint of pressure relaxation and contact resistance. The dot-like buffer electrodes can be formed by, for example, screen printing.

Preferably, a transparent resin such as an ethylene/vinyl acetate copolymer (EVA), ethylene/vinyl acetate/triallyl isocyanurate (EVAT), polyvinyl butyrate (PVB), silicon, urethane, acryl or epoxy is used as a sealing material for forming the solar cell module.

Preferably, the light-receiving side protective material for forming the solar cell module is disposed on the light-receiving side (light-incident side) of each solar cell to protect the surface of the solar cell module. Examples of the light-receiving side protective material include glass substrates (e.g., blue plate glass substrates and white plate glass substrates), and organic films such as fluororesin films such as polyvinyl fluoride films (e.g., Tedlar Film (registered tradename)) and polyethylene terephthalate (PET) films. Among them, glass substrates are preferable, and white plate glass substrates are more preferable from the viewpoint of the strength, the light transmittance (including dependency on wavelength of light transmittance of light on short-wavelength side and long-wavelength side), costs in comparison with other industrially available materials, and moisture protection on the light-receiving side. As described above, a comb-like light-receiving side electrode is generally used on the light-receiving side of the solar cell, and therefore influences of moisture are significant on the light-receiving side. In this respect, white plate glass substrates are more preferable.

Examples of the back side protective material for forming the solar cell module include insulating transparent substrates (e.g., glass substrates such as blue plate glass substrates and white plate glass substrates), and single-layer or laminated films (e.g., single-layer structures or laminated structures of organic films such as fluororesin films such as polyvinyl fluoride films (e.g., Tedlar Film (registered tradename) and polyethylene terephthalate (PET) films). The laminated film may have a structure in which a metal foil composed of aluminum or the like is sandwiched between organic films.

A solar cell module including as a metal electrode a metal foil to be used in I-V measurement can be prepared in the manner described above.

EXAMPLES

Hereinafter, the present invention will be described in detail by showing examples, but the present invention is not limited to the following examples.

Example 1

In Example 1, a solar cell as shown in FIG. 1 was prepared in the following manner. For the prepared solar cell, I-V measurement was performed using an I-V measurement device as shown in FIG. 4.

As a single-crystalline silicon substrate 1, an n-type single-crystalline silicon substrate having an incident surface with a (100) plane orientation and having a thickness of 200 μm was used. The substrate was washed in acetone, immersed in a 2 wt % HF aqueous solution for 5 minutes to remove a silicon oxide layer on a surface, and rinsed twice with ultra-pure water. The thus prepared substrate 1 was immersed for 15 minutes in a 5/15 wt % KOH/isopropyl alcohol aqueous solution held at 75° C. Finally, the substrate 1 was immersed in a 2 wt % HF aqueous solution for 5 minutes, rinsed twice with ultra-pure water, and dried at normal temperature. The surfaces of the single-crystalline silicon substrate 1 were observed with an atomic force microscope (AFM) (manufactured by Pacific Nanotechnology Company). Quadrangular pyramid-like textured structures having an exposed (111) surface were formed on the incident surface and the back surface of the substrate, and the arithmetic mean roughness was 2100 nm.

The single-crystalline silicon substrate 1 after the etching was introduced into a CVD apparatus, and an i-type amorphous silicon layer was formed as an intrinsic silicon-based thin-film layer 2a in a thickness of 4 nm on the incident surface. On the i-type amorphous silicon layer, a p-type amorphous silicon layer was formed as a conductive silicon-based thin-film layer 3a in a thickness of 5 nm. Conditions for formation of the i-type amorphous silicon layer were the followings: the substrate temperature was 180° C.; the pressure was 130 Pa; the $SiH_4/H_2$ flow rate ratio was 2/10; and the input power density was 0.03 W/cm$^{-2}$. Conditions for formation of p-type amorphous silicon layer were the followings: the substrate temperature was 190° C.; the pressure was 130 Pa; the $SiH_4/H_2/B_2H_6$ flow rate ratio was 1/10/3; and the input power density was 0.04 W/cm$^{-2}$. As the $B_2H_6$ gas mentioned above, a gas diluted with $H_2$ to a $B_2H_6$ concentration of 5000 ppm was used. The substrate 1 was transferred to a sputtering chamber without being exposed to air, and on the p-type amorphous silicon layer, an indium oxide layer was formed as a transparent electrode 4 in a thickness of 120 nm on the front side. As a sputtering target, one obtained by adding 10% by weight of Sn to $In_2O_3$ was used.

Next, an i-type amorphous silicon layer was formed on the back surface as an intrinsic silicon-based thin-film layer 2b in a thickness of 5 nm. On the i-type amorphous silicon layer, an n-type amorphous silicon layer was formed as a conductive silicon-based thin-film layer 3b in a thickness of 10 nm. Conditions for formation of the i-type amorphous silicon layer were the same as those on the incident surface side. Conditions for formation of the n-type amorphous silicon layer were the followings: the substrate temperature was 180° C.; the pressure was 60 Pa; the $SiH_4/PH_3$ flow rate ratio was 1/2; and the input power density was 0.02 W/cm$^{-2}$. As the $PH_3$ gas mentioned above, a gas diluted with $H_2$ to a $PH_3$ concentration of 5000 ppm was used. Next, on the n-type amorphous silicon layer, an indium oxide layer was formed in a thickness of 100 nm as a back side transparent electrode 5 by a sputtering method.

A silver paste was applied onto the indium oxide layer as the front side transparent electrode 4 by screen printing, thereby forming a comb-like electrode as a collecting electrode 6.

As described above, FIG. 4 is a schematic view that exclusively shows a configuration on the back side of the solar cell. A metal foil with an Ag layer formed as a contact metal layer 21a (thickness: 0.7 μm) on an Al foil as a metal base material 21b (thickness: 25 μm) was used as a first metal foil 21 (thickness: 25.7 μm), an Al foil was used as a second metal foil 22 (thickness: 25 μm), and a stainless steel plate coated with Au was used as a metal plate 40 (thickness: 20 mm). The first metal foil 21 and the second metal foil 22 were disposed on the metal plate 40, the solar cell was suctioned from a suction hole 50 (diameter: 1 mm) via opening sections 31 and 32 (each having a diameter of 1.5 mm) of the metal foils 21 and 22 by a pump with a pressure of 75 kPa. I-V measurement was performed in this state. Here, an I-V measurement device (WXS-100S-L3XXH manufactured by Wacom Co., Ltd.) was used. In Example 1, a metal plate having 80 suction holes arranged at intervals of 15 mm was used. In Example 1, gap portions were formed in regions constituting about 99.88% of the surface of the back side transparent electrode. The ratio of the gap portions was determined by observing the surface of the first metal foil using an electron microscope (HITACHI S-4800 manufactured by Hitachi, Ltd., magnification: 200,000).

Comparative Example 1

In Comparative Example 1, I-V measurement for a solar cell prepared by the same method as in Example 1 was performed in the same manner as in Example 1, except that the metal plate 40 (made of stainless steel, thickness: 20 mm) coated with Au (thickness: 100 μm) was used and a metal foil was not used.

In I-V measurement, a pressure rise due to leakage of air from the suction hole was observed. This suggests that the back side transparent electrode is not in contact with the metal plate at all in microscopic local regions.

Reference Example 1

In Reference Example 1, a solar cell was prepared by the same method as in Example 1, Ag was then deposited in a thickness of 100 nm on the back side transparent electrode 5 by a sputtering method to prepare a normal heterojunction solar cell. I-V measurement for the prepared heterojunction solar cell was performed in the same manner as in Example 1 except that the metal plate 40 (made of stainless steel, thickness: 20 mm) coated with Au (thickness: 100 μm) was used and a metal foil was not used.

I-V measurement results in Example 1, Comparative Example 1 and Reference Example 1 are shown in Table 1. Table 1 shows ratios determined based on the values in Example 1.

TABLE 1

|  | Voc | Isc | FF | Eff |
|---|---|---|---|---|
| Example 1 | 100.0% | 100.0% | 100.0% | 100.0% |
| Comparative Example 1 | 94.0% | 75.0% | 89.0% | 62.7% |
| Reference Example 1 | 100.0% | 99.0% | 100.0% | 99.0% |

It has been confirmed that the short circuit current density (Jsc) in Example 1 calculated by dividing the short circuit current (Isc) by the area of the solar cell is 36.7 mA/cm$^2$, which is comparable to the value in Reference Example 1, i.e., a common heterojunction solar cell. This indicates that a current generated by light irradiation was collected in Example 1, as with a solar cell having a back electrode.

It has been confirmed that in Example 1, a fill factor (FF) comparable to that in Reference Example 1 is shown. This suggests that in Example 1, a contact comparable to that in a normal heterojunction solar cell was obtained.

On the other hand, it has been confirmed that in Comparative Example 1, the short circuit current (Isc) and the open circuit voltage (Voc) are reduced as compared to Reference Example 1, and in particular, the short circuit current (Isc) is dramatically reduced. This indicates that in Comparative Example 1, the back side transparent electrode was in direct in contact with a rigid metal plate, and contact resistance on the back side was extremely deteriorated, so that a current was not recovered.

Thus, it is considered that by bringing the back side transparent electrode and the flexible metal foil into detachable contact with each other, I-V measurement of the solar cell can be easily performed. Accordingly, good products and defective products can be discriminated before formation of the metal electrode on the back side, so that production costs can be reduced.

Example 2

In Example 2, a solar cell module as shown in FIG. 7 was prepared in the following manner. First, a back side transparent electrode 5, a front side transparent electrode 4 and a collecting electrode 6 were formed by the same method as in Example 1 to prepare an in-process solar cell product. Thereafter, the back side transparent electrode 5 and a metal foil 120 for IC were brought into contact with each other to prepare a finished solar cell product. As the metal foil 120 for IC, a first metal foil 121 (thickness: 25.7 μm) with an Ag layer formed as a contact metal layer 121a (thickness: 0.7 μm) on an Al foil as a metal base material 121b (thickness: 25 μm) was used. The first metal foil 121 does not have an opening section. The prepared finished solar cell product was disposed between a glass substrate as a light-receiving side protective material 130 and a PET film base material as a back side protective material, and laminated and sealed with an EVA resin as a sealing material 140.

Reference Example 2

In Reference Example 2, an in-process solar cell product was prepared by the same method as in Example 2, Ag was then deposited in a thickness of 100 nm on the back side transparent electrode 5 by a sputtering method to prepare a normal heterojunction solar cell. The prepared heterojunction solar cell was disposed between a glass substrate as a light-receiving side protective material 130 and a PET film base material as a back side protective material, and laminated and sealed with an EVA resin as a sealing material 140.

The photoelectric conversion characteristics of the solar cell modules prepared in Example 2 and Reference Example 2 were evaluated using a solar simulator. Table 2 shows ratios determined based on the values in Example 2.

TABLE 2

|  | Voc | Isc | FF | Eff |
|---|---|---|---|---|
| Example 2 | 100.0% | 100.0% | 100.0% | 100.0% |
| Reference Example 2 | 100.0% | 99.2% | 98.6% | 97.9% |

From Table 2, it has been confirmed that in Example 2 where a flexible metal foil was used as the metal electrode on the back side, the open circuit voltage (Voc) is comparable to that in Reference Example 2 where the metal electrode on the back side was formed by a sputtering method. On the other hand, it has been confirmed that Example 2 exhibited a higher short circuit current (Isc) and a higher fill factor (FF) as compared to Reference Example 2.

Figure 9:
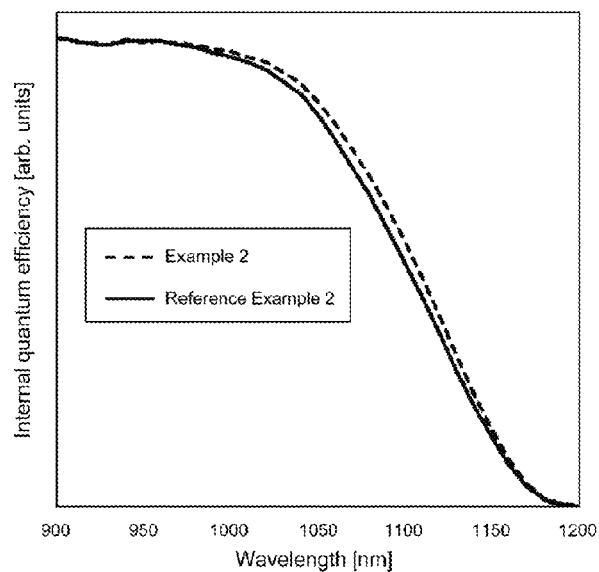
FIG. 9 is a graph showing an internal quantum efficiency in a long wavelength region for solar cell modules prepared in Example 2 and Reference Example 2.

FIG. 9 is a graph showing an internal quantum efficiency in a long wavelength region for solar cell modules prepared in Example 2 and Reference Example 2. The dependency of the internal quantum efficiency on the wavelength (spectral sensitivity) as shown in FIG. 9 suggests that in Example 2, plasmon absorption at the interface between the back side transparent electrode and the metal electrode is suppressed, and therefore the spectral sensitivity on the long-wavelength side is high, so that the current value is improved, as compared to Reference Example 2.

Thus, it is considered that by using a flexible metal foil as the metal electrode on the back side, photoelectric conversion characteristics comparable to or higher than those of a solar cell module including normal heterojunction solar cells.

DESCRIPTION OF REFERENCE CHARACTERS 1 single-crystalline silicon substrate of a first conductivity-type
2a, 2b intrinsic silicon-based thin-film layer
3a silicon-based thin-film layer of an opposite-conductivity-type
3b silicon-based thin-film layer of a first-conductivity-type
4 front side transparent electrode
5 back side transparent electrode
6 collecting electrode
10, 110 solar cell (in-process solar cell product)
20, 220 metal foil
21, 121 first metal foil
21a, 121a contact metal layer
21b, 121b metal base
22 second metal foil
25, 125 air gap portion
31 first opening section
32 second opening section
40 metal plate
50 suction hole
60 buffer electrode
100 solar cell module
120 metal foil for IC
130 light-receiving side protective material
140 sealing material
150 tab line
160 back sheet

The invention claimed is:

1. An I-V measurement device for a solar cell comprising an I-V measurement section that is configured to supply current to the solar cell to perform I-V measurement, wherein
the I-V measurement section includes a flexible metal foil to be in direct, detachable contact with the solar cell under pressure during the I-V measurement,
at least a portion of the flexible metal foil to be in contact with the solar cell, the flexible metal foil is formed of at least one selected from the group consisting of Sn, Ag, Ni, In and Cu,
the flexible metal foil has an opening, and
the solar cell is suctioned via the opening such that a transparent electrode on a second surface side of the solar cell is pressed against the flexible metal foil.

2. The I-V measurement device for a solar cell according to claim 1, wherein
the I-V measurement section further includes a rigid metal plate on the flexible metal foil on a side opposite to the side contacting with the solar cell during the I-V measurement,
the flexible metal foil includes the opening extending through the flexible metal foil toward a rigid metal plate side, and
the rigid metal plate has a suction hole which overlaps the opening, and
the I-V measurement section is configured to suction the solar cell via the opening of the flexible metal foil from the suction hole of the rigid metal plate, thereby the flexible metal foil and the solar cell are allowed to be brought into detachable contact with each other to perform I-V measurement.

3. The I-V measurement device for a solar cell according to claim 2, wherein
the flexible metal foil has a plurality of openings, and
the rigid metal plate has a plurality of suction holes.

4. The I-V measurement device for a solar cell according to claim 2, wherein the opening of the flexible metal foil is larger than the suction hole of the rigid metal plate.

5. The I-V measurement device for a solar cell according to claim 1, wherein
the flexible metal foil includes a first metal foil,
the first metal foil comprises a metal base material and a contact metal layer formed on a surface of the metal base material,
the contact metal layer is formed of at least one selected from the group consisting of Sn, Ag, Ni, In and Cu,
in the I-V measurement section, the flexible metal foil is disposed in such a manner that the contact metal layer is allowed to face the solar cell, thereby the contact metal layer and the solar cell are brought into detachable contact with each other to perform I-V measurement.

6. The I-V measurement device for a solar cell according to claim 5, wherein the flexible metal foil further includes a second metal foil on the first metal foil on a side opposite to the contact metal layer being formed.

7. The I-V measurement device for a solar cell according to claim 1, wherein a thickness of the flexible metal foil is 4 to 190 μm.

8. The I-V measurement device for a solar cell according to claim 1, wherein
the solar cell to be subjected to the I-V measurement is an unfinished solar cell,
the unfinished solar cell includes: a single-crystalline silicon substrate; a collecting electrode on a first surface side of the single-crystalline silicon substrate; and the transparent electrode on an outermost surface on the second surface side of the single-crystalline silicon substrate, and
the I-V measurement section is configured such that the flexible metal foil and the transparent electrode on the second surface side of the unfinished solar cell are allowed to be brought into direct, detachable contact with each other under pressure, thereby the flexible metal foil follows undulations of the single-crystalline silicon substrate of the unfinished solar cell, and the first surface side of the unfinished solar cell is set as a light-receiving surface during the I-V measurement.

9. A method for manufacturing a solar cell, comprising steps in the order of:
providing an unfinished solar cell including a collecting electrode on a first surface side of a single-crystalline silicon substrate, and a transparent electrode on an outermost surface on a second surface side of the single-crystalline silicon substrate;
conducting an I-V measurement of the unfinished solar cell; and
judging whether the unfinished solar cell is a good product or a defective product based on a result of the I-V measurement, wherein
in the I-V measurement, a current is supplied to the unfinished solar cell in a state where a flexible metal foil and the transparent electrode on the second surface side of the unfinished solar cell are brought into direct, detachable contact with each other under pressure such that the flexible metal foil follows undulations of the single-crystalline silicon substrate, and the first surface of the unfinished solar cell is set as a light-receiving surface,
at least on a portion of the flexible metal foil that is in contact with the transparent electrode on the second surface side of the unfinished solar cell, the flexible metal foil is formed of at least one selected from the group consisting of Sn, Ag, Ni, In and Cu,
the flexible metal foil has an opening, and
the unfinished solar cell is suctioned via the opening such that the transparent electrode on the second surface side of the unfinished solar cell is pressed against the flexible metal foil.

10. The method for manufacturing a solar cell according to claim 9, wherein
after the I-V measurement, a metal electrode is formed on the transparent electrode on the second surface side of the unfinished solar cell.

11. The method for manufacturing a solar cell according to claim 10, wherein
the metal electrode is formed for only the unfinished solar cell judged as a good product.

12. The method for manufacturing a solar cell according to claim 9, wherein
the flexible metal foil includes a first metal foil,
the first metal foil comprises a metal base material and a contact metal layer formed on a surface of the metal base material,
the contact metal layer is formed of at least one selected from the group consisting of Sn, Ag, Ni, In and Cu,
the flexible metal foil is disposed in such a manner that the contact metal layer faces the transparent electrode on the second surface side of the in-process solar cell, and
the I-V measurement is performed in a state where the contact metal layer and the transparent electrode are brought into detachable contact with each other.

13. The method for manufacturing a solar cell according to claim 12, wherein the flexible metal foil further includes a second metal foil on a side opposite to the side contacting with the unfinished solar cell.

14. The method for manufacturing a solar cell according to claim 9, wherein
in a state in which the metal foil and the transparent electrode are in detachable contact with each other, the second surface side of the unfinished solar cell has a pyramid-like irregularity structure such that gap portions are provided between the metal foil and 80% or more and less than 100% of the surface of the transparent electrode.

15. The method for manufacturing a solar cell according to claim 9, wherein a thickness of the flexible metal foil is 4 to 190 μm.

16. The method of claim 9, wherein
a rigid metal plate having a suction hole is arranged on a back side of the metal foil, and
the opening in the metal foil and the suction hole on the rigid metal plate overlap each other.

* * * * *